US008718580B2

(12) United States Patent
Borodulin et al.

(10) Patent No.: US 8,718,580 B2
(45) Date of Patent: May 6, 2014

(54) BROADBAND HIGH EFFICIENCY AMPLIFIER SYSTEM INCORPORATING DYNAMIC MODULATION OF LOAD IMPEDANCE

(75) Inventors: Dimitri Borodulin, South Lebanon, OH (US); George Cabrera, Mason, OH (US)

(73) Assignee: HBC Solutions, Inc., Engelwood, CO (US)

( * ) Notice: Subject to any disclaimer, the term of this patent is extended or adjusted under 35 U.S.C. 154(b) by 75 days.

(21) Appl. No.: 13/294,583

(22) Filed: Nov. 11, 2011

(65) Prior Publication Data

US 2013/0122837 A1 May 16, 2013

(51) Int. Cl.
H01Q 11/12 (2006.01)
H04B 1/04 (2006.01)

(52) U.S. Cl.
USPC ..................................... 455/127.1; 455/127.3

(58) Field of Classification Search
USPC ............... 455/91, 114.2–114.3, 127.1–127.5; 375/295–297
See application file for complete search history.

(56) References Cited

U.S. PATENT DOCUMENTS

| 6,954,623 | B2 | 10/2005 | Chang et al. | |
|---|---|---|---|---|
| 7,102,444 | B2 | 9/2006 | Shanjani et al. | |
| 7,173,484 | B2* | 2/2007 | Rabinovich et al. | 330/52 |
| 7,262,656 | B2 | 8/2007 | Shiikoma | |
| 8,005,445 | B2 | 8/2011 | Kuriyama et al. | |
| 8,049,565 | B2 | 11/2011 | Zhang et al. | |
| 8,095,092 | B2* | 1/2012 | Muller et al. | 455/127.1 |
| 2004/0189381 | A1 | 9/2004 | Louis | |
| 2005/0134377 | A1* | 6/2005 | Dent | 330/124 R |
| 2005/0163254 | A1* | 7/2005 | Suzuki et al. | 375/297 |
| 2006/0238245 | A1* | 10/2006 | Carichner et al. | 330/136 |
| 2006/0246855 | A1* | 11/2006 | Kato et al. | 455/102 |
| 2007/0205827 | A1* | 9/2007 | Mobbs | 330/124 R |
| 2009/0278599 | A1* | 11/2009 | Pengelly | 330/124 R |
| 2010/0130145 | A1* | 5/2010 | Jang | 455/114.3 |

(Continued)

FOREIGN PATENT DOCUMENTS

| EP | 2169823 A1 | 3/2010 |
|---|---|---|
| WO | WO 2004/088837 A2 | 10/2002 |

OTHER PUBLICATIONS

Burns, "Highly Efficient Amplifier Shows he Promise of Doherty Architecture", www.rfdesign.com, Jun. 2007, 3 pages.

(Continued)

*Primary Examiner* — Simon Nguyen
(74) *Attorney, Agent, or Firm* — Tarolli, Sundheim, Covell & Tummino LLP

(57) ABSTRACT

Systems and methods are provided for producing an amplified radio frequency (RF) signal representing a baseband input signal. A first amplifier amplifies a first intermediate signal to provide a first amplified signal. Second and third amplifiers amplify a second intermediate signal to provide second and third amplified signals. A signal combiner combines the first, second, and third amplified signals to produce the amplified RF signal. An RF modulator modulates an RF carrier signal with a baseband input signal to provide the first and second intermediate signals. The RF modulator provides the first and second intermediate signals such that the first amplified signal is out-of-phase with each of the second and third amplified signals at an output of an active device within the second amplifier when the amplitude of the baseband input signal exceeds a threshold voltage and in phase when the baseband input signal is below a threshold voltage.

9 Claims, 5 Drawing Sheets

(56) References Cited

U.S. PATENT DOCUMENTS

2010/0289571 A1  11/2010  Hong et al.
2011/0095828 A1   4/2011  Zhang et al.
2012/0258677 A1*  10/2012 Dupuy et al. .............. 455/127.2

OTHER PUBLICATIONS

Mitzlaff, et al., "Novel Combiner Circuits for a Doherty RF Power Amplifier", www.ip.com—Prior Art Database, Jul. 22, 2002, 12 pgs.

* cited by examiner

BROADBAND HIGH EFFICIENCY AMPLIFIER SYSTEM INCORPORATING DYNAMIC MODULATION OF LOAD IMPEDANCE

TECHNICAL FIELD

The present invention relates to radio frequency (RF) communication systems and is particularly directed to systems and methods for high power amplification of RF signals.

BACKGROUND OF THE INVENTION

An electronic amplifier is a device for increasing the power of a signal. Generally, an amplifier outputs energy from a provided power supply and controls the output to match an associated shape of an input signal with a larger amplitude. There are many types of electronic amplifiers, and they are commonly used in radio and television transmitters and receivers, high-fidelity stereo equipment, microcomputers and other electronic digital equipment, and audio amplifiers.

SUMMARY OF THE INVENTION

In accordance with an aspect of the present invention, a system is provided for modulating a radio frequency (RF) carrier signal with a baseband signal and amplifying the resulting modulated RF signal. A first amplifier, on a first signal path, is configured to amplify a first intermediate signal to provide a first amplified signal. A second amplifier, on a second signal path, is configured to amplify a second intermediate signal to provide a second amplified signal. A third amplifier, on the second signal path, is configured to amplify the second intermediate signal to provide a third amplified signal. A signal combiner is configured to combine the first amplified signal, the second amplified signal, and the third amplified signal to produce the amplified RF signal. An RF modulator is configured to modulate an RF carrier signal with a baseband input signal to provide the first intermediate signal on a first signal path and the second intermediate signal on the second signal path. The RF modulator provides the first and second intermediate signals such that the first amplified signal is out-of-phase with each of the second and third amplified signals at an output of an active device within the second amplifier when the amplitude of the baseband input signal exceeds a threshold voltage and the first amplified signal is in phase with each of the second and third amplified signals at the output of the active device within the second amplifier when the baseband input signal is below a threshold voltage.

In accordance with another aspect of the present invention, a system is provided for providing an amplified RF signal representing a baseband input signal. An RF modulator is configured to provide a first intermediate signal on a first signal path and a second intermediate signal on a second signal path from the baseband input signal. A first amplifier, on the first signal path, is configured to amplify the first intermediate signal to provide a first amplified signal. A second amplifier, on the second signal path, is configured to amplify the second intermediate signal to provide a second amplified signal. A third amplifier, on the second signal path, is configured to amplify the second intermediate signal to provide a third amplified signal. A signal combiner is configured to combine the first amplified signal, the second amplified signal, and the third amplified signal such that a load impedance at respective outputs of active devices within the second and third amplifiers is modulated by the first amplified signal. The RF modulator provides the first intermediate signal such that the load impedance at the output of the active devices within the second and third amplifiers is increased when an amplitude of the baseband input signal is within a voltage range, bounded by first and second threshold voltages, and the load impedance at the output of the active devices within the second and third amplifiers is decreased when the amplitude of the baseband input signal exceeds the voltage range.

In accordance with yet another aspect of the present invention, a method is provided for providing an amplified RF signal from a baseband input signal. The baseband input signal is distorted to produce a first intermediate baseband signal. The first intermediate baseband signal has a voltage increasing with an increase in a voltage of the baseband input signal when the voltage of the baseband input signal is outside of a voltage range, bounded by a first threshold voltage value and a second threshold voltage value, and decreasing with an increase in the voltage of the baseband input signal when the voltage of the baseband input signal is within the voltage range. A carrier signal is modulated with the first intermediate baseband signal to provide a first intermediate RF signal. The carrier signal is modulated with a second intermediate baseband signal to provide a second intermediate RF signal. The first intermediate RF signal is amplified at a first amplifier to produce a first amplified signal. The second intermediate RF signal is amplified at each of a second amplifier and a third amplifier to produce a second amplified signal and a third amplified signal. The first amplified signal, the second amplified signal, and the third amplified signal are combined to provide the amplified RF signal.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

Figure 1:
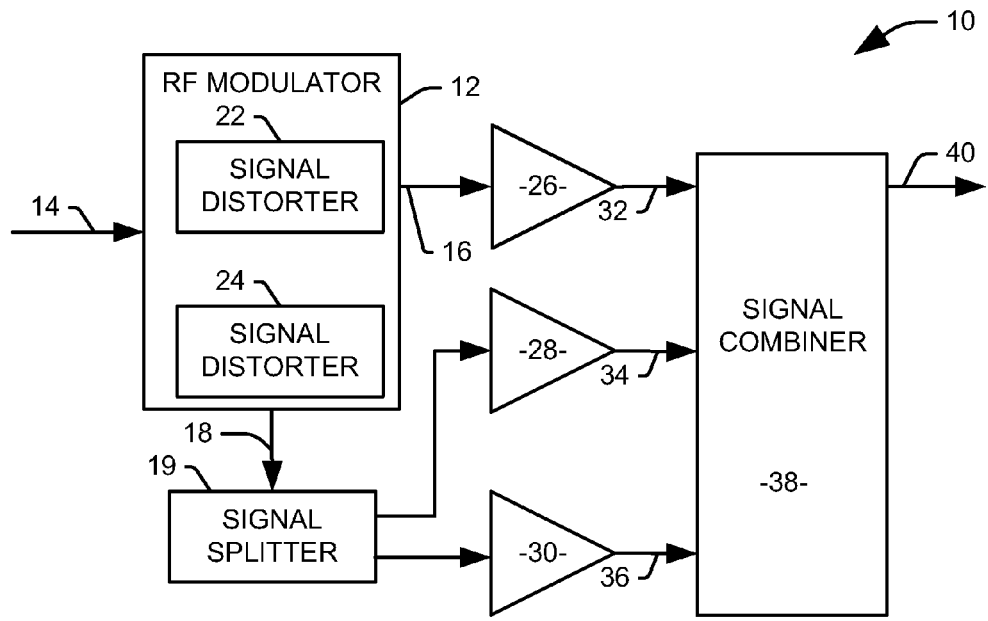
FIG. 1 is a functional block diagram of an amplifier system in accordance with an aspect of the present invention.

FIG. 1 is a functional block diagram of an amplifier system 10 in accordance with an aspect of the present invention. The system 10 includes an RF (radio frequency) modulator 12 configured to receive a baseband input signal 14 and produce at least first and second intermediate RF signals 16 and 18 characterizing the input baseband signal. By "characterizing the input baseband signal" it is meant that the amplitude modulation of the first and second intermediate signals 16 and 18 are derived from the input baseband signal.

In accordance with an aspect of the present invention, the RF modulator 12 includes first and second signal distorters 22 and 24 configured to provide one of phase and amplitude distortion to the baseband input signal to provide respective first and second intermediate baseband signals (not shown). These intermediate baseband signals can be upconverted, by any appropriate means, to provide the first and second intermediate RF signals 16 and 18. The upconverters 74 and 84 can be implemented using any method that allows the assignment of baseband signal content to the RF carrier. It may include any means appropriate in the art for signal formation, such as spectrum shaping filters, direct digital synthesis, mirror image frequency cancellation, and similar processes.

The first intermediate RF signal 16 is provided as an input to an auxiliary amplifier 26, and the second intermediate RF signal 18 is provided, through a signal splitter 19, as an input to a plurality of main amplifiers 28 and 30. For example, the second intermediate RF signal 18 can be distributed to the main amplifiers 28 and 30 via a 3 dB quadrature signal splitter to ensure a proper distribution of the signal to each amplifier. Each of the amplifiers 26, 28, and 30 includes an active RF power generating device, such as a bipolar junction transistor (BJT), a metal-oxide semiconductor field effect transistor (MOSFET), or an electronic tube. The amplifiers 26, 28, and 30 provide respective first, second, and third RF output signals 32, 34, and 36, each representing an amplified version of the intermediate RF signal 16 and 18 provided to its associated amplifier 26, 28, and 30.

The RF output signals 32, 34, and 36 provided by the amplifiers 26, 28, and 30 are delivered to a signal combiner 38. The signal combiner 38 is a 3 dB quadrature combiner, with the outputs 34 and 36 of main amplifiers provided to through and coupled ports of the quadrature combiner and the output of the auxiliary amplifier 32 provided to an isolation port of the combiner. After being combined by the signal combiner 38 into a single output 40 the output signal has the amplitude modulation that is a replica of the baseband input signal.

In accordance with an aspect of the present invention, the RF modulator 12 can be configured to distort at least one of the phase and amplitude of the intermediate RF signals 16 and 18 to increase the efficient dynamic range (EDR) of the system. For example, when the level of baseband input signal is low, the RF modulator can provide the intermediate RF signals such that the auxiliary amplifier 26 is the only active amplifier. Once all of the amplifiers 26, 28, and 30 are active, the RF modulator 12 can distort the intermediate RF signals 16 and 18 such that their corresponding amplified signals arrive out-of-phase at the output port of each active device inside the second and third amplifiers 28 and 30 when the amplitude of the input signal exceeds a threshold voltage and in phase when the input signal is below a threshold voltage. The amplified RF signals are combined such that the first amplified signal 32 modulates the load impedance at the outputs of active devices within the second and third amplifiers 28 and 30. This results in amplifiers 28 and 30 operating in saturation over extended range of input signal levels and improves RF/DC efficiency of the system.

Figure 2:
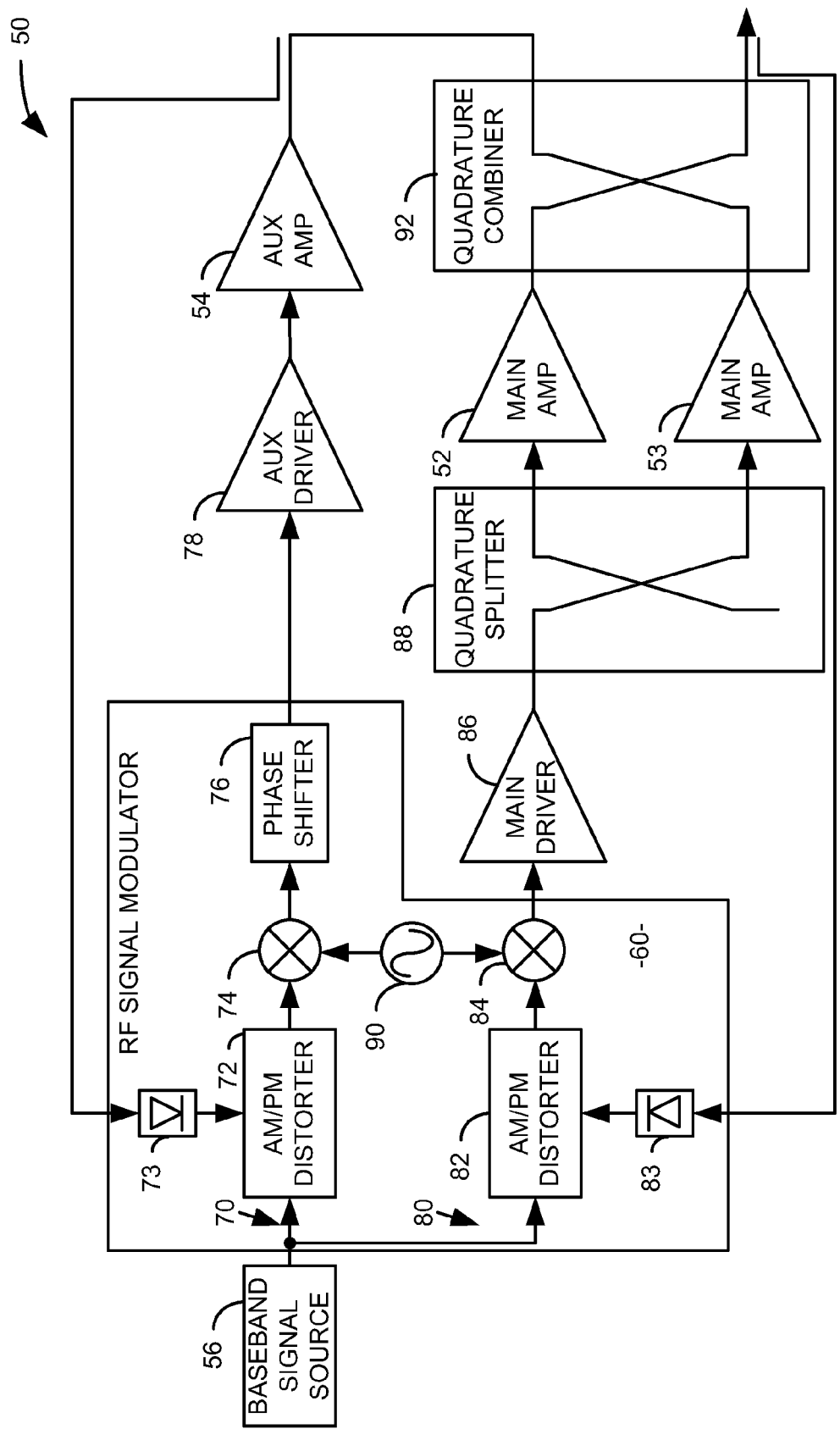
FIG. 2 is a functional block diagram of one implementation of a multiple amplifier system in accordance with an aspect of the present invention.

FIG. 2 is a functional block diagram of one implementation of an amplifier system 50 in accordance with an aspect of the present invention. In the illustrated system, three power amplifiers 52-54 are used to amplify an input signal generated from an associated baseband signal source 56, including two main amplifiers 52 and 53 and an auxiliary amplifier 54. It will be appreciated that the amplifiers 52-54 can include any appropriate assemblies for high power amplification of RF signals. For example, each amplifier 52-54 can contain one or more active devices, a direct current (DC) power supply for the active devices, and appropriate impedance matching circuitry at the input and output of the device. The active devices can be implemented to include, for example, metal-oxide semiconductor field effect transistors (MOSFETs), bipolar junction transistors (BJTs), junction gate field effect transistors (JFETs), or vacuum tubes.

Figure 3:
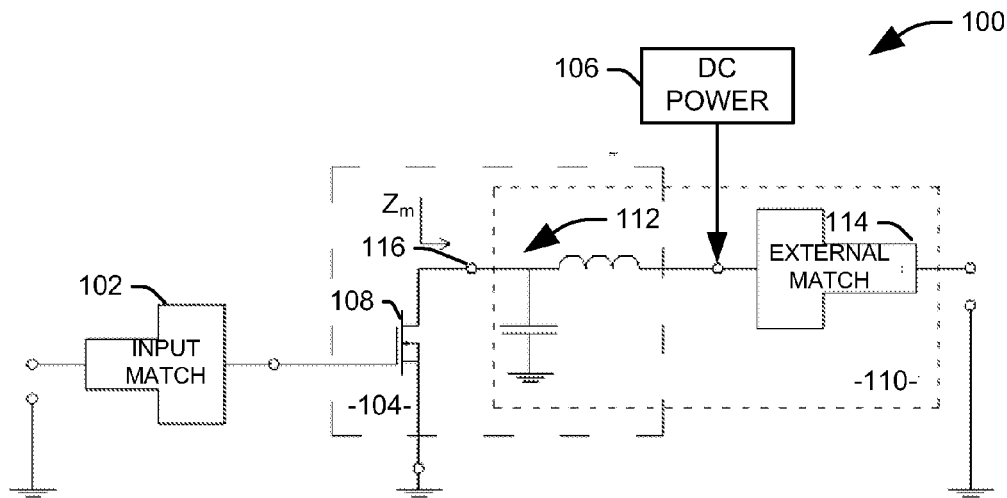
FIG. 3 illustrates one example of an amplifier that can be used in a system in accordance with an aspect of the present invention.

FIG. 3 illustrates one example of an amplifier 100 that can be used in a system in accordance with an aspect of the present invention. The amplifier 100 includes an input impedance matching component 102, an active device 104, a direct current (DC) power supply 106, and an output impedance matching network 110. While the amplifier 100 is shown with one active device 104, it will be appreciated that an amplifier in accordance with an aspect of the present invention can include multiple active devices. In the illustrated implementation, the active device 104 is implemented with a MOSFET 108.

The impedance matching network 110 includes internal matching circuitry 112 and an external impedance matching component 114. The impedance matching network 110, taken as a whole, can be characterized by distributed parameters, denoted as $$\begin{pmatrix} S_{11} & S_{12} \\ S_{21} & S_{22} \end{pmatrix}.$$

It will be appreciated that, throughout this document, reference is made to the output of the active device of a given amplifier. This is intended to refer to a point 116 upstream of the impedance matching network 110, including any portion 112 of the impedance matching network 110 that is within the active device.

Returning to FIG. 2, the baseband input signal is provided to a radio frequency (RF) modulator 60 configured to provide one or both of amplitude modulation (AM) and phase modulation (PM) to the input signal and distribute the signal along main and auxiliary paths 70 and 80. The RF modulator 60 can include respective signal distorters 72 and 82 configured to provide one or both of amplitude and phase distortion to the baseband output signal on their respective input path 70 and 80.

In accordance with an aspect of the present invention, the signal distorters 72 and 82 are configured to create three distinct amplitude stages, according to the amplitude of the input signal, such that the distortion applied to the input signal varies with the input signal amplitude. For example, when the input signal amplitude is below a first threshold voltage, the first signal distorter 72 can produce a signal on the first signal path 70 expected to provide an output at the auxiliary amplifier 54 having an amplitude modulation that is a replica of the input baseband signal. In other words, the amplitude of the output signal is a substantially linear function of the amplitude of the input signal. In this stage, the second signal distorter 82 produces a signal on the second signal path 80 expected to provide no output at the main amplifiers 52 and 53. In the illustrated implementation, the first threshold voltage, $V_{T1}$, can be determined as the ratio of saturation voltage of the auxiliary amplifier, $V_{aux\_sat}$, to an amplitude response, G, of the amplifier system 50. The amplitude response of the system can be expressed as:

$$G = \left|\frac{V_{out\_max}}{V_{in\_max}}\right| \qquad \text{Eq. 1}$$

where $V_{out\_max}$ is the maximum voltage of output RF signal and $V_{in\_max}$ is a maximum voltage of the input signal.

When the input signal amplitude is above the first threshold voltage but below a second threshold voltage, the second signal distorter 82 can produce a signal on the second signal path 80 expected to provide an RF output signal at each main amplifier 52 and 53 having output proportional to the input baseband signal, such that the main amplifiers 52 and 53 provide an output that is a substantially linear function of the input baseband signal. The first signal distorter 72 can produce a signal on the first signal path 70 expected to produce an RF output signal by the auxiliary amplifier 54 in which amplitude is decreasing with an increase to baseband signal amplitude. After arriving at the corresponding input of output combiner, the RF signal propagates to the output ports of main amplifier and further on to the output ports of the active devices inside of the main amplifiers 52 and 53. The phase of the signal is tuned by first signal distorter 72 to be in-phase with RF signal generated by the active devices. In the illustrated implementation 50, the first signal distorter 72 provides a signal expected to drive the auxiliary amplifier in phase with the main amplifiers during this stage. The second threshold voltage, $V''_{in}$, can be determined as:

$$V''_{in} = \frac{|V''_{out\_max}|}{G} = \qquad \text{Eq. 2}$$
$$\frac{|V''_{out\_max}|}{|V_{out\_max}|} V_{in\_max} = \frac{2}{EDR} \cdot \frac{r}{1-r} \cdot V_{in\_max} \text{ where } r = \frac{Z_{m\_sat}}{Z_{m\_0}}$$

is the impedance modulation index, $Z_{m\_0}$ is a load impedance when the auxiliary amplifier is mute, $Z_{m\_sat}$ is a load impedance when the auxiliary amplifier is in saturation, and $$EDR = \frac{V_{out\_max}}{V_{aux\_sat}}$$

is the Efficient Dynamic Range.

When the input signal amplitude is above the second threshold voltage, the second signal distorter 82 can produce a signal of sufficient amplitude on the second signal path 80 to drive both main amplifiers to voltage saturation mode, producing output voltage $V_{m\_sat}$. The first signal distorter 72 can produce a signal on the first signal path 70 expected to provide an output at the auxiliary amplifier 54 expected to decrease the impedance at the outputs of the main amplifiers 52 and 53, increasing the power output by these amplifiers. In the illustrated implementation 50, the first signal distorter 72 provides a signal expected to meet the RF signal generated by active device inside of each Main amplifier one hundred eighty degrees out-of-phase.

In addition to the selective signal distortion described above, the signal distorters 72 and 82 can also provide amplitude and phase predistortion to the baseband input signal to correct for distortion introduced by the amplifiers 52-54 and other components in the amplification path. This predistortion can be dynamic, with an output of the auxiliary amplifier 54 sampled and provided to the first signal distorter 72 through a first downconverter 73, and the system output sampled and provided to the second signal distorter 82 through a second downconverter 83.

The outputs of the signal distorters can be provided to respective modulators 74 and 84 configured to apply one or both of amplitude and phase modulation to a carrier signal, provided by a local oscillator 90 to represent a desired signal content, represented by the baseband signal. A phase shifter 76 can be used to account for different phase shift values required at different carrier frequencies such that a desired phase shift between the signal provided by the auxiliary amplifier 54 and the signals provided by each of two main amplifiers 52 and 54 can be achieved at the corresponding output port of active device inside of each of two main amplifiers. As explained previously, the desired phase shift between the amplifier outputs will vary with the amplitude of the input signal.

The phase shifted signal is provided to an auxiliary driver amplifier 78 that provides a preliminary amplification to the auxiliary path signal before providing it to the auxiliary amplifier 54. In the illustrated implementation, the one or more active devices within the auxiliary amplifier 54 are biased for class AB operation, although it will be appreciated that other configurations are possible in systems in accordance with an aspect of the present invention.

The main signal path includes a main driver amplifier 86 that provides a preliminary amplification to the main path signal. The output of the main driver amplifier is provided to a quadrature splitter 88 configured to evenly distribute the signal between inputs of two main amplifiers 52 and 53. For example, the quadrature splitter 84 can be a 3-dB ninety degree directional coupler. The main amplifiers can be similar in construction and contain the same components. In such a case, they will have similar features, including gain, impedances, and power. In the illustrated implementation, the two main amplifiers 52 and 53 can be configured to operate in class C. For example, each main amplifier can be biased such that the amplifier transitions from cut-off into active mode during input baseband signal transition through the first input threshold voltage.

The outputs of the main amplifiers 52 and 53 are provided to a quadrature combiner 92 as first and second inputs. In one implementation, the quadrature combiner 92 can be a 3-dB ninety degree directional coupler. Specifically, the outputs of the main amplifiers are provided to the through and coupled ports of the quadrature combiner 92. The output of the auxiliary amplifier 54 is provided to an isolation port of the quadrature combiner 92. The signal provided at the isolation port modulates the load impedance of the main amplifiers 52 and 53, allowing for increased power output from the system.

The implementation 50 illustrated in FIG. 2 provides a number of advantages. RF communication signals created with digital modulation techniques can be characterized by a Peak-to-Average Power Ratio (PAPR). The high definition television broadcast industry employs such modulation standards, for example, in the Very High Frequency (VHF) and Ultra High Frequency (UHF) bands. One example would be the Digital Video Broadcasting—Terrestrial (DVB-T) modulation used in many countries around the world. A single TV channel can include many spectral carriers (e.g., thousands) tightly spaced over an 8 MHz frequency range. To maintain in-band intermodulation distortions (IMD) under the industry specified limit the amplified broadcasted signal should have PAPR of 8 dB or higher. Another example is the 8-level vestigial sideband modulation (8-VSB) standard, which is used in USA, Canada, and Mexico to broadcast TV over the air. To meet IMD requirements the transmitted signal should have PAPR of 6 dB or higher. Currently used Class AB RF amplifiers operate at average power levels backed off from their peak power capability by the factor of PAPR. This leads to a relatively low DC-RF efficiency. By using our dynamic load impedance modulation technique the power capability of the auxiliary amplifier can be scaled to modulate load impedance of main amplifiers over desired amplitude range. As a result of this the main amplifiers would operate at voltage saturation mode over part of output power range—for example, from the average to the peak level, contributing to the overall system efficiency.

In addition, this method is not frequency sensitive. By adjusting the phase shift of the RF signal that propagates through the auxiliary path a wide range of carrier frequencies can be used. Most countries have their frequency range allocated for television (TV) channels that spans from 470 MHz to 862 MHz at UHF and from 175 MHz to 252 MHz at VHF. The TV allocated frequency span at UHF is 59% wide and at VHF is 36% wide. In accordance with an aspect of the present invention, a high efficiency amplifier can operate at a frequency range as wide as the bandwidth of a 3-dB directional coupler, which can be 100% or even more by adding sections to the input and output 3-dB directional couplers, allowing for a transmitter to operate across a given allotted frequency span without any hardware adjustment.

Figure 4:
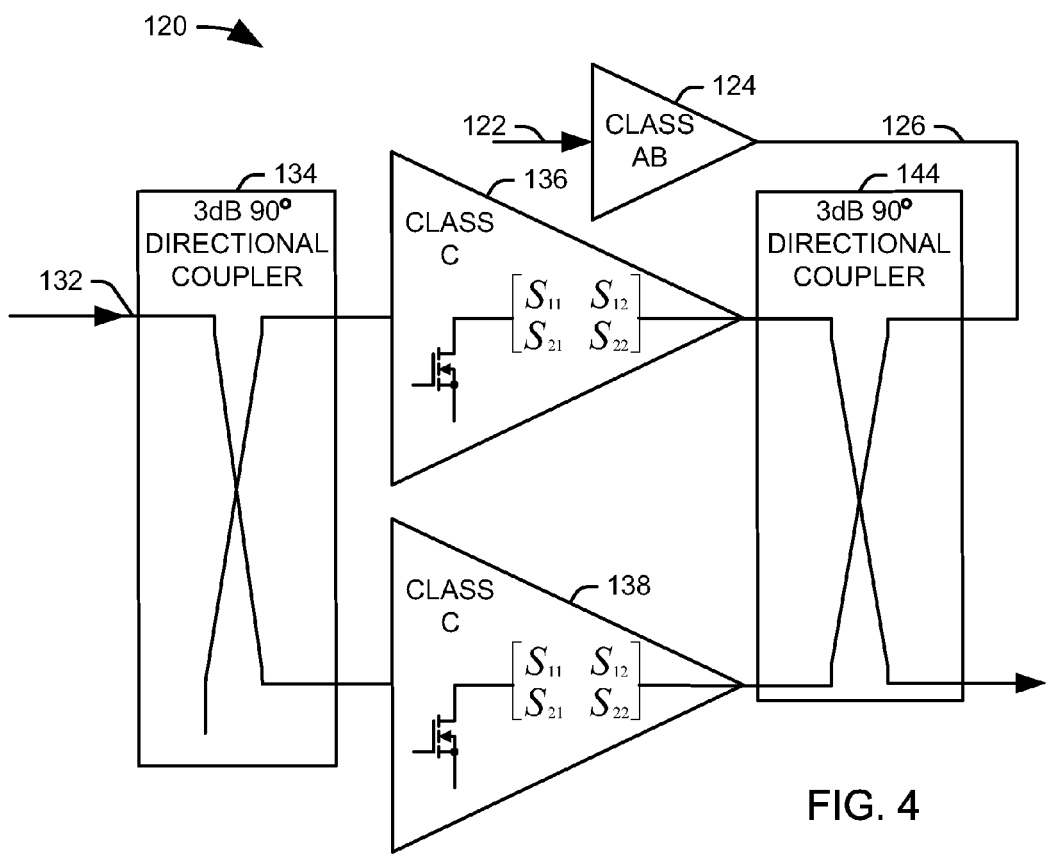
FIG. 4 illustrates the usage of an S-parameter matrix to represent an output matching network of each main amplifier.

FIG. 4 illustrates an amplifier assembly 120 in accordance with an aspect of the present invention. A first modulated RF signal 122 is provided to a class AB auxiliary amplifier 124 which amplifies the signal to produce a first amplified signal 126. A second modulated RF signal 132 is provided to a first 3 dB ninety degree directional coupler 134 that distributes the signal evenly between first and second main amplifiers 136 and 138. The main amplifiers are implemented as class C amplifiers. Each main amplifier 136 and 138 includes an output matching network described by distributed parameters, $$\begin{pmatrix} S_{11} & S_{12} \\ S_{21} & S_{22} \end{pmatrix}.$$

Figure 5:
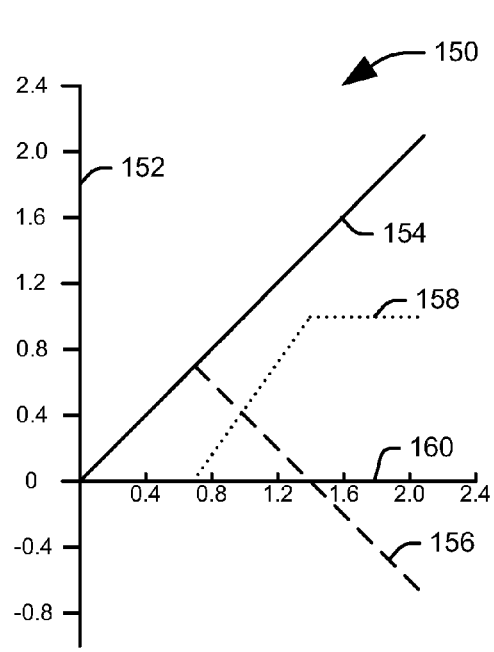
FIG. 5 is a chart illustrating, for a first implementation of the system of FIG. 2, normalized amplitudes of the system output, the auxiliary amplifier output, and the output of each main amplifier as a function of the amplitude of the input signal.

The output ports of active devices inside each main amplifier 136 and 138 are connected to the corresponding input ports of a second 3 dB ninety degree directional coupler 144 through the output matching networks. The output port of the auxiliary amplifier 124 is connected to an isolation port of the second directional coupler 144. The resulting interaction between the amplifier outputs in the assembly shown in FIG. 4, given modulated RF inputs as described in FIG. 2, is shown graphically in FIGS. 5 and 6. Each chart 150 and 170 illustrates a normalized amplitude 152 of the system output, shown as a solid line 154, the auxiliary amplifier output, shown as a dashed line 156, and the output of each main amplifier, shown as a dotted line 158, for the system of FIG. 2 as a function of the amplitude of the baseband input signal 160. All output voltages 152, 154, 156, and 158 are normalized by the saturation voltage of the main amplifiers, $V_{main\_sat}$. Where the amplitude is shown to be negative in the auxiliary amplifier output 156, it indicates that the output of the auxiliary amplifier is changing phase by 180°. In FIG. 5, for the purpose of example, the auxiliary amplifier is assigned a saturation voltage, $V_{aux\_sat}$, of $$\frac{V_{m\_sat}}{\sqrt{2}} \approx 0.707.$$

Figure 6:
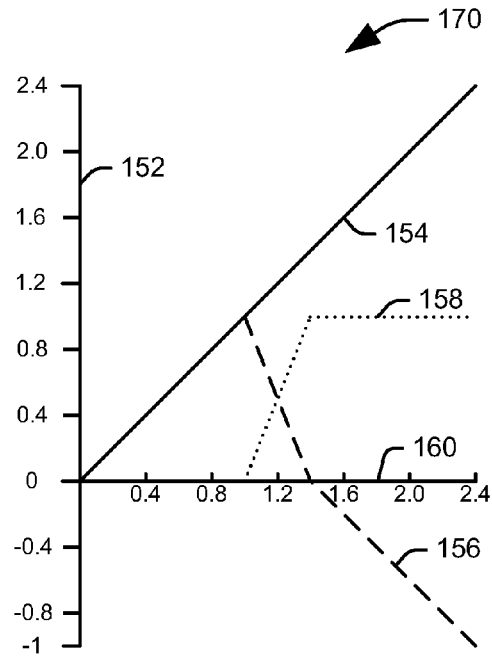
FIG. 6 is a chart illustrating, for a second implementation of the system of FIG. 2, normalized amplitudes of the system output, the auxiliary amplifier output, and the output of the main amplifier as a function of the amplitude of the input signal.

FIG. 6 is a similar chart 170, sharing the same numbering, but assigning that the main amplifiers and the auxiliary amplifier equal saturation voltages of one volt. To simplify the example, the max input voltage, $V_{in\_max}$, is given a value $\sqrt{2}*V_{m\_sat}+V_{aux\_sat}$ such that the amplitude response, G, of the system in these examples is equal to one.

In this example, the outputs of the auxiliary and main amplifiers can each be expressed as a piecewise function of the input signal amplitude, with the ranges of the piecewise function being bounded by the first and second threshold voltages described previously and the max input, $V_{in\_max}$. For example, the signal distorter 72 associated with the auxiliary amplifier can be configured such that the amplitude response of auxiliary amplifier, $|V_{aux}|$, can be expressed as:

$$V_{aux} = \begin{cases} V_{aux\_sat} \cdot EDR \cdot \frac{V_{in}}{V_{in\_max}}, & 0 \le V_{in} < \frac{V_{in\_max}}{EDR} \\ \frac{V_{aux\_sat}}{1-3r}\left(EDR \cdot \frac{V_{in}}{V_{in\_max}}(1-r)-2r\right), & \frac{V_{in\_max}}{EDR} \le V_{in} < \frac{2}{EDR} \cdot \frac{r}{1-r} \cdot V_{in\_max} \\ \frac{V_{aux\_sat}}{\frac{2}{EDR} \cdot \frac{r}{1-r}-1}\left(\frac{V_{in}}{V_{in\_max}}-\frac{2}{EDR} \cdot \frac{r}{1-r}\right), & \frac{2}{EDR} \cdot \frac{r}{1-r} \cdot V_{in\_max} \le V_{in} \le V_{in\_max} \end{cases} \quad \text{Eq. 3}$$

where $V_{aux\_sat} = \frac{1}{\sqrt{2}} V_{m\_sat} \frac{(1-S_{22})}{S_{22}} \frac{r}{1-r}, 0 < r \le 1.$ The signal distorter 82 associated with the main amplifiers can be configured such that the amplitude response each main amplifier, $|V_{min}|$, can be expressed as:

$$V_{main} = \begin{cases} 0, & 0 \le V_{in} < \frac{V_{in\_max}}{EDR} \\ \frac{V_{m\_sat}}{\frac{2}{EDR} \cdot \frac{r}{1-r}-V_{in\_max}}(EDR \cdot V_{in}-1), & \frac{V_{in\_max}}{EDR} \le V_{in} < \frac{2}{EDR} \cdot \frac{r}{1-r} \cdot V_{in\_max} \\ V_{m\_sat}, & \frac{2}{EDR} \cdot \frac{r}{1-r} \cdot V_{in\_max} \le V_{in} \le V_{in\_max} \end{cases} \quad \text{Eq. 4}$$

As can be seen in FIGS. 5 and 6, when the input signal amplitude is below the first threshold value, both main amplifiers are muted and the auxiliary amplifier output increases substantially linearly with the amplitude of the baseband input signal.

When the baseband input signal reaches the first threshold value, at $$\frac{1}{\sqrt{2}}$$

volts in FIG. 5 and at 1 volt in FIG. 6, the main amplifiers become active, and both main amplifiers 52 and 53 deliver a mutually balanced radio frequency (RF) signal at corresponding ports of the second directional coupler. With all of the amplifiers active, the signal output by the auxiliary amplifier propagates through the second directional coupler and arrives at the output ports of main amplifiers 52 and 53, specifically to the output port of the active device or devices inside of each main amplifier, changing the load impedance presented at the port. The direction of the change is determined by the phase and amplitude relationship between signals at the output port of the active device inside of the main amplifiers 52 and 53. If the signals are in phase, as they are between first and second threshold voltage, the impedance experienced at the outputs of the active devices within the main amplifiers is higher than the nominal impedance $Z_{m\_0}$.

As the amplitude of the input signal increases, the amplitude of the main amplifiers outputs increase linearly and the amplitude of the auxiliary signal is reduced effectively reducing impedance at the output ports of the active devices within the main amplifiers 52 and 53. At the second threshold voltage, equal to $\sqrt{2}$ in each of FIGS. 5 and 6, the main amplifiers reach their saturation voltage and the auxiliary amplifier is mute. At this point, the load impedance presented at the output of each main amplifier 52 and 53, is the load impedance, designated here as $Z_0$. The corresponding nominal impedance at the output ports of active devices inside the main amplifiers is $$Z_{m\_0} = Z_0 \frac{(1+S_{11})}{(1-S_{11})}$$

Above the second threshold voltage, the auxiliary amplifier output is provided out-of-phase with the main amplifier output, such that the RF signal generated by auxiliary amplifier 54 is combined in-phase with the signals generated by main amplifiers 52 and 53 at the output port of the second directional coupler. As discussed previously, the phase shifter 74 allows adjustment of the phase of the auxiliary signal path 70 relative to the main signal path 80. The phase is selected such that the signals generated by auxiliary amplifier 54 and the main amplifiers 52 and 53 are out-of-phase at the output port of active device inside of each main amplifier. During reflection from the output of Active device, operating in voltage saturation mode, the RF signal of auxiliary amplifier changes phase 180° and propagates along with the RF signals generated by the main amplifiers to the output load.

The impedance presented at the output port of the active device inside of the main amplifier in voltage saturation mode, $Z_{m\_sat}$, can be expressed as a function of the voltage of the auxiliary amplifier output, $V_{aux}$, the voltage generated by the main amplifiers when operating in saturation, $V_{m\_sat}$, and the nominal impedance presented at the output port of the active devices of the main amplifier when no signal is received from the auxiliary amplifier, $Z_{m\_0}$ as:

$$Z_{m\_sat} = \frac{Z_{m\_0}}{1-\sqrt{2} \cdot \frac{V_{aux}}{V_{m\_sat}} \cdot \frac{S_{12}}{1-S_{11}}} \quad \text{Eq. 5}$$

From Eq. 5, it will be appreciated from that when the auxiliary amplifier is producing no signal, the impedance is unchanged. When the signal from the auxiliary amplifier 54 is in-phase with the signal from main amplifier 52 and 53, $V_{aux}$ is positive and the impedance is increased. When the signal from the auxiliary amplifier 54 is out-of-phase with the signal from the main amplifier 52 and 53, $V_{aux}$ is negative and the impedance is decreased.

An active RF power device operating in a voltage saturation mode becomes more or less a voltage source and as such exhibits very low output impedance. Therefore, each main amplifier 52 and 53 can be considered as RF voltage source when the voltage amplitude at the output port of active devices situated inside of the amplifiers reaches the high voltage limit. The voltage limit is set by the DC power supply that feeds the output electrode of the active device or devices.

A typical value of output impedance of a voltage saturated active RF power device is between 0.1 ohm and 0.3 ohm. A typical value of the load impedance presented at the output of this device is from 5 ohm to 10 ohm. Therefore, the typical load line impedance is an order of magnitude higher than the output impedance of the device. Hence, an active device operating in saturation mode can be qualified as a fairly good voltage source. Accordingly, the amplitude of the RF voltage at the output port of the device can be expected to be substantially constant and any RF signal applied from an external power source to the output port of the device will be reflected back due to high reflection coefficient. The phase of the reflected signal will be shifted by one hundred eighty degrees.

While the main amplifiers are operating in saturation, the amount of power generated by each main amplifier, $P_{main\_sat}$, can be expressed as:

$$P_{main\_sat} = \frac{P_{main\_0}}{r} \quad \text{Eq. 6}$$

where $P_{main\_0}$ is a nominal saturated output power of the main amplifier.

The voltage of the combined signal, $V_{out}$, at the output of the second quadrature combiner that is terminated to a matching load can be represented as:

$$V_{out} = -j \frac{S_{21}}{1+S_{11}} \left( \sqrt{2} V_{m\_sat} - V_{aux} S_{12} \right) + S_{22} V_{aux} \quad \text{Eq. 7}$$

The corresponding output power, $P_{out}$, can be represented as:

$$p'''_{out\_} = \text{Re} \frac{\left[ \frac{S_{21}}{1+S_{11}} \left( \sqrt{2} V_{m\_sat} - V_{aux} S_{12} \right) + S_{22} V_{aux} \right]^2}{Z_0} \quad \text{Eq. 8}$$

FIGS. 7-10 are charts 210, 220, 230, and 240 illustrating dynamic characteristics of the system of FIG. 2. The horizontal axis 202 of each chart represents a voltage of the input signal, and the charts are aligned such that horizontal axis are scaled equally and corresponding values on the horizontal axes coincide. It will be appreciated that all of the values are normalized to a nominal impedance of one ohm and all output voltages are normalized by the saturation voltage of the main amplifiers, $V_{m\_sat}$. The auxiliary amplifier is assumed to have a saturation voltage, $V_{aux\_sat}$, of $$\frac{V_{m\_sat}}{\sqrt{2}} \approx 0.707.$$

One of skill in the art, from this simplified example, will understand the operation of the system described herein.

The first threshold voltage value, corresponding to the input voltage at which the auxiliary amplifiers reach saturation, is represented by a first vertical dotted line 204. Specifically, the first threshold voltage 204 represents the ratio of the saturation voltage of the auxiliary amplifier to an amplitude response of the system. The second threshold voltage value, corresponding to the input voltage at which the main amplifiers reach saturation is represented by a second dotted line 205. The second threshold voltage value is proportional to a ratio of the saturation voltage of the main amplifier to the amplitude response of the system. A third input voltage value, corresponding to a maximum input voltage, is represented by a third dotted line 206.

Figure 7:
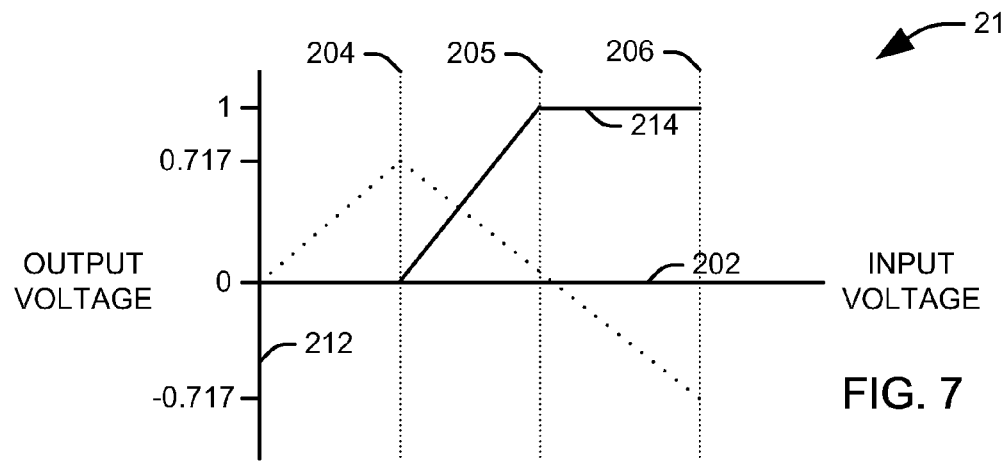
FIGS. 7-10 are charts illustrating the technical characteristics of one implementation of the system of FIG. 2.

FIG. 7 is a chart 210 illustrating the output voltage, represented by the vertical axis 212, produced by each main amplifier 214 and the auxiliary amplifier 216. As was shown previously in FIG. 5, under the first threshold voltage 204, the auxiliary amplifier is the only amplifier operating, providing an output amplitude that is a substantial replica of the baseband input signal. Between the first threshold voltage 204 and the second threshold voltage 205, the auxiliary amplifier is operated in phase with the main amplifiers. At the second threshold voltage 205, the main amplifiers are driven in saturation, where they remain up to the maximum input voltage 206, while the auxiliary amplifier is operated out-of-phase with the main amplifier, at an amplitude that increases substantially linearly with the input voltage.

Figure 8:
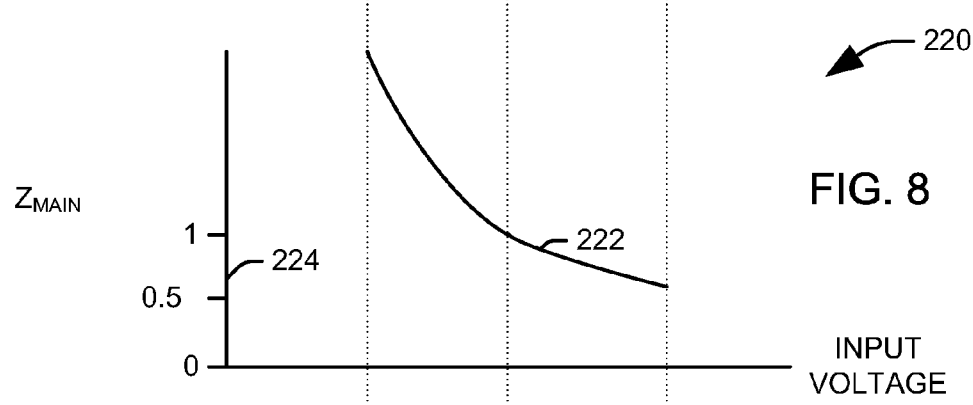

FIG. 8 is a chart 220 illustrating the normalized impedance 222 at the outputs of the main amplifiers, represented by the vertical axis 224. With the main amplifier mute, the impedance up to the first threshold voltage 204 is effectively infinite. Once the auxiliary amplifier reaches saturation at the first threshold voltage 204, the main amplifier becomes active, and the voltage of the auxiliary amplifier is gradually reduced, with an accompanying reduction in the impedance. When the auxiliary amplifier is mute at the second threshold voltage 205, the impedance returns to the nominal value. When the auxiliary amplifier is operated out-of-phase with the main amplifier, at input voltages above the second threshold voltage, the impedance is reduced as the output voltage of the auxiliary amplifier increases, until the auxiliary amplifier reaches saturation. At this point, a minimum impedance of half the load impedance is achieved.

Figure 9:
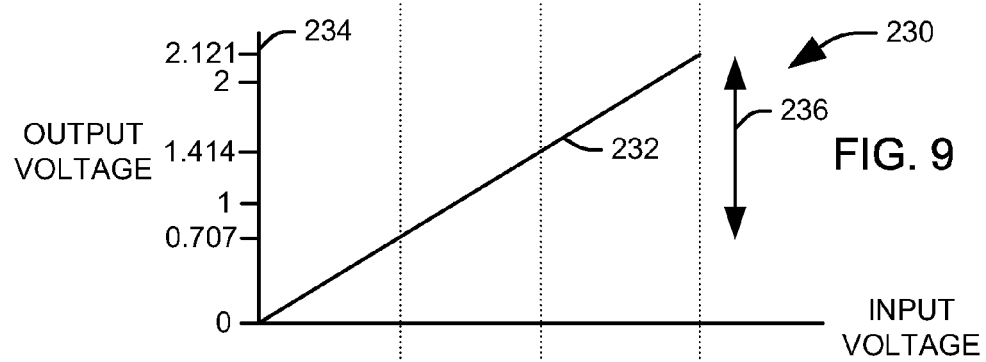

FIG. 9 is a chart 230 illustrating the normalized output voltage 232, represented by the vertical axis 234, produced by the system. It will be appreciated that the system voltage at and below the first threshold input voltage 204 is simply the output of the auxiliary amplifier. At the first threshold input voltage 204, the auxiliary amplifier reaches its saturation voltage (0.707 on the normalized chart), and the main amplifiers become active. At the second threshold input voltage 205, the main amplifiers reach saturation, and the auxiliary amplifier is mute. At this point, the total output of the system is simply the contribution of the main amplifiers, equal to $\sqrt{2}V_{m\_sat}$. Above the second threshold input voltage 205, the auxiliary amplifier contributes to the system output 232, which reaches a maximum value of $\sqrt{2}V_{m\_sat} - V_{aux\_sat}$ at the peak input voltage 206, where the output of the auxiliary amplifier is out-of-phase with the output of the main amplifier, and thus represented as a negative voltage. It will be appreciated that the system is operating within its efficient range of the system at all input signal voltages above the first threshold voltage 204, providing an efficient dynamic range 236 of around EDR=9.54 dB.

Figure 10:
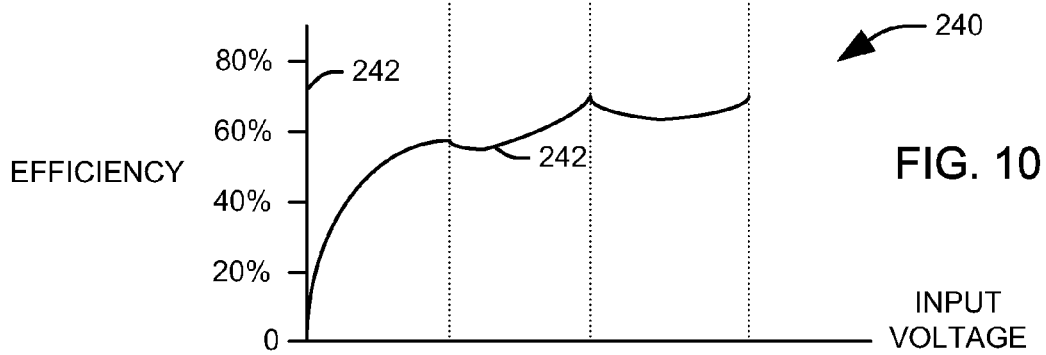

FIG. 10 is a chart 240 illustrating the efficiency 242, represented by the vertical axis 244, of the amplifier system of FIG. 2. It will be appreciated that the efficiency up until the first threshold voltage 204 is what would be expected from a power amplifier, specifically the auxiliary amplifier, biased in class AB. Once the main amplifiers become active, however, efficiency of the system gradually increases with the output of the main amplifiers, reaching a peak value when the main amplifiers reach saturation at the second threshold voltage value 205. At this point, the auxiliary amplifier is mute. As the signal at the output of auxiliary amplifier is increased toward saturation, the efficiency dips slightly, returning to the peak value when all three amplifiers are in saturation.

Figure 11:
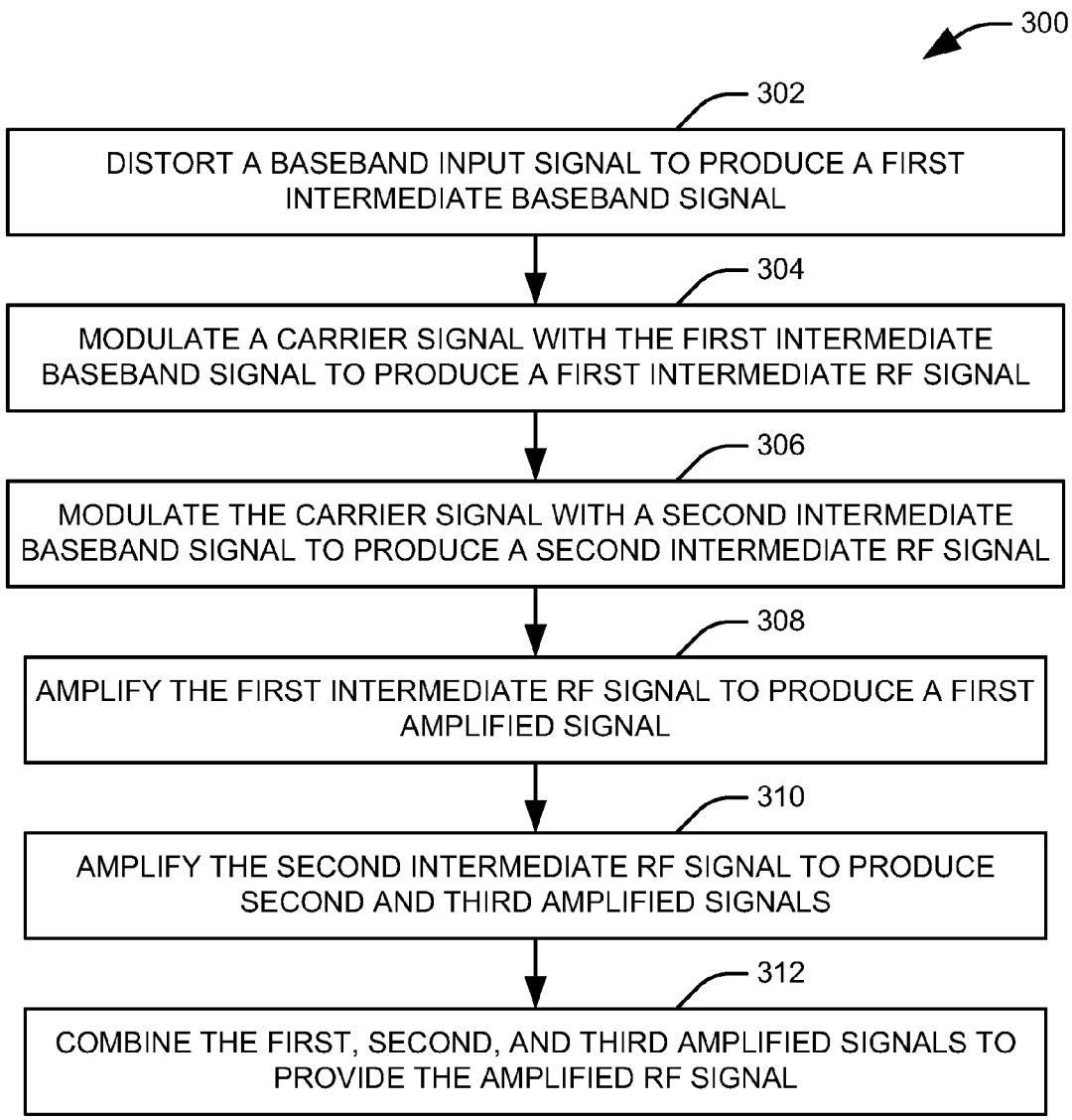
FIG. 11 illustrates one example of a method for providing an amplified radio frequency (RF) signal from a baseband input signal.

FIG. 11 illustrates one example of a method 300 for providing an amplified radio frequency (RF) signal from a baseband input signal. At 302, the baseband input signal is distorted to produce a first intermediate baseband signal. In accordance with an aspect of the present invention, the baseband input signal is distorted such that the first intermediate baseband signal has a voltage that increases with an increase in a voltage of the baseband input signal when the voltage of the baseband input signal is outside of a voltage range, bounded by a first threshold voltage value and a second threshold voltage value, and decreasing with an increase in the voltage of the baseband input signal when the voltage of the baseband input signal is within the voltage range.

At 304, a carrier signal is modulated with the first intermediate baseband signal to provide a first intermediate RF signal. At 306, a second intermediate baseband signal to provide a second intermediate RF signal. It will be appreciated that the second intermediate baseband signal can represent a distorted instance of the baseband input signal. For example, the baseband input signal can be distorted such that one or more amplifiers driven by the second intermediate baseband signal are in saturation when the baseband input voltage is above the voltage range. Similarly, the baseband input signal can be distorted such that one or more amplifiers driven by the second intermediate baseband signal are mute when the baseband input voltage is below the first threshold voltage.

At 308, the first intermediate RF signal is amplified at a first amplifier to produce a first amplified signal. At 310, the second intermediate RF signal is amplified at each of a second amplifier and a third amplifier to produce a second amplified signal and a third amplified signal. In one implementation, the first intermediate baseband signal is produced such that the first amplified signal is in phase with the second amplified signal within the voltage range and out-of-phase with the second amplified signal when the baseband input voltage is above the voltage range.

At 312, the first amplified signal, the second amplified signal, and the third amplified signal are combined to provide the amplified RF signal. For example, the signals can be combined with a 3 dB quadrature combiner. In accordance with an aspect of the present invention, the first amplified signal, the second amplified signal, and the third amplified signal are combined such that a load impedance at an output of active devices within the second and third amplifiers is modulated by the first amplified signal. In one implementation, the first intermediate baseband signal, can be produced such that the load impedance at the output of the active devices within the second and third amplifiers is increased when the baseband input voltage is within the voltage range and the load impedance at the output of the active devices within the second and third amplifiers is decreased when the baseband input voltage is above the voltage range.

From the above description of the invention, those skilled in the art will perceive improvements, changes, and modifications. Such improvements, changes, and modifications within the skill of the art are intended to be covered by the appended claims.

Having described the invention we claim:

1. A system for providing an amplified radio frequency (RF) signal representing a baseband input signal, the system comprising:
    a first amplifier, on a first signal path, configured to amplify a first intermediate signal to provide a first amplified signal;
    a second amplifier, on a second signal path, configured to amplify a second intermediate signal to provide a second amplified signal;
    a third amplifier, on the second signal path, configured to amplify the second intermediate signal to provide a third amplified signal;
    a signal combiner configured to combine the first amplified signal, the second amplified signal, and the third amplified signal to produce the amplified RF signal; and
    an RF modulator configured to modulate an RF carrier signal with a baseband input signal to provide the first intermediate signal on a first signal path and the second intermediate signal on the second signal path, the RF modulator providing the first and second intermediate signals such that the first amplified signal is out-of-phase with each of the second and third amplified signals at an output of an active device within the second amplifier when the amplitude of the baseband input signal exceeds a first threshold voltage and the first amplified signal is in phase with each of the second and third amplified signals at the output of the active device within the second amplifier when the baseband input signal is below the first threshold voltage;
    wherein the RF modulator is further configured to provide the second intermediate signal only when the baseband input signal amplitude is above a second threshold voltage, higher than the first threshold voltage, such that the first amplifier is active and the second and third amplifiers are not active, and to provide the first intermediate signal to the first amplifier such that the amplitude of the first amplified signal increases substantially linearly with the amplitude of the baseband input signal when the amplitude of the baseband input signal is below the first threshold voltage, decreases as the amplitude of the baseband input signal increases when the amplitude of the baseband input signal is between the first threshold voltage and the second threshold voltage, and increases, but is out-of-phase with each of the second and third amplified signals, when the amplitude of the baseband input signal exceeds the second threshold voltage.

2. The system of claim 1, the RF modulator being configured to provide the second intermediate signal to the second and third amplifiers such that the amplitude of the second and third amplified signals each vary substantially linearly with the amplitude of the baseband input signal when the amplitude of the baseband input signal is between the first threshold voltage and the second threshold voltage, and second and third amplifiers operate in saturation when the amplitude of the baseband input signal exceeds the second threshold voltage.

3. The system of claim 1, the RF modulator being configured to.

4. The system of claim 1, the RF modulator being configured, when the amplitude of the baseband input signal is below the first threshold voltage, to provide the first intermediate signal to the first amplifier such that the amplitude of the first amplified signal is equal to the product of the amplitude of the baseband input signal and an amplitude response of the system, wherein the amplitude response of the system is determined as a linear combination of respective saturation voltages of the first, second, and third amplifiers divided by a peak voltage of the baseband input signal.

5. The system of claim 1, wherein the threshold voltage is proportional to a ratio of a saturation voltage of the first amplifier to an amplitude response of the system, wherein the amplitude response of the system is determined as a linear combination of respective saturation voltages of the first and second amplifiers divided by a peak voltage of the baseband input signal.

6. The system of claim 1, the first amplifier being biased in class AB and each of the second and third amplifiers being biased in class C.

7. The system of claim 1, the signal combiner comprising a quadrature combiner, the first amplified signal being provided to an isolation port of the quadrature combiner and the second and third amplified signals being provided to respective through and coupled ports of the quadrature combiner.

8. The system of claim 1, wherein the signal combiner is configured such that a load impedance at the output of the active device within the second amplifier is modulated by the first amplified signal.

9. The system of claim 1, further comprising a 3 dB quadrature signal splitter configured to distribute the second intermediate signal to the second and third amplifiers.

* * * * *